(12) United States Patent
Tamura (10) Patent No.: US 6,410,168 B1
(45) Date of Patent: Jun. 25, 2002

(54) ORGANIC ELECTROLUMINESCENCE ELEMENT

(75) Inventor: Shinichiro Tamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/352,751

(22) Filed: Jul. 14, 1999

(30) Foreign Application Priority Data

Jul. 21, 1998 (JP) .......................................... 10-205516

(51) Int. Cl.$^7$ ............................................... H05B 33/00
(52) U.S. Cl. ...................... 428/690; 313/505; 313/506; 313/509
(58) Field of Search ................................ 428/690, 917; 313/502–509

(56) References Cited

U.S. PATENT DOCUMENTS 5,189,549 A * 2/1993 Leventis et al. ............ 359/271
5,841,230 A * 11/1998 Ikoma et al. ................ 313/506
6,013,983 A * 1/2000 Asano et al. ................ 313/581

* cited by examiner

Primary Examiner—Cynthia H. Kelly
Assistant Examiner—Dawn L. Garrett
(74) Attorney, Agent, or Firm—Sonnenschein, Nath & Rosenthal (57) ABSTRACT

Disclosed is an organic electroluminescence element capable of reducing reflection of light from an electrode layer, thereby ensuring a sufficient display contrast in the case where the element is used for a display. The organic luminescence element includes a first electrode layer; an organic electroluminescence layer formed adjacent to one surface of the first electrode layer; a second electrode layer formed adjacent to the other surface of the organic electroluminescence layer, the second electrode layer having an optical reflectance to visible light specified in a range of 50% or less; and a low optical reflection layer formed on the second electrode layer on the opposed side to the surface adjacent to the organic electroluminescence layer. The low optical reflection layer includes at least one or more layers including a layer having an optical reflectance to visible light specified in a range of 10% or less.

10 Claims, 4 Drawing Sheets

ORGANIC ELECTROLUMINESCENCE ELEMENT

RELATED APPLICATION DATA

The present application claims priority to Japanese Application No. P10-205516 filed Jul. 21, 1998, which application is incorporated herein by reference to the extent permitted by law.

BACKGROUND OF THE INVENTION

The present invention relates to an organic electroluminescence element including an organic compound which emits light when a current is injected thereinto, and particularly to an organic electroluminescence element suitably used for an ultrathin organic EL (Electroluminescence) display.

A display is generally classified into a fixed type Braun tube or CRT (Cathode Ray Tube) and a flat panel display developed for satisfying requirements toward portability and thinning. The Braun tube, which is high in luminance and good in repeatability of color, is frequently used at present; however, it is disadvantageous in that the occupied volume is large, the weight is heavy, and the power consumption is large. On the other hand, the flat panel display, which is lightweight and is superior in luminous efficiency to the Braun tube, is expected to be used for a display screen of a computer or a television set. At present, as the flat panel display, an active matrix drive type LCD (Liquid Crystal Display) is put into commercial production. The LCD has no spontaneous light emission function, and therefore, it displays an image with the aid of external light (backlight). As a result, the LCD is disadvantageous in that the viewing angle is narrow, the power consumption of the backlight becomes large when the LCD is used in a dark environment because of the lack of spontaneous light emission function, and the responsivity to a high definition and high speed video signal expected to be practically used in the future will be probably insufficient.

As a display capable of solving the above-described various problems, an organic EL display using an organic electroluminescence material which emits light when a current is injected thereinto becomes a focus of attention in recent years. The organic EL display, which is a spontaneous light emission type flat panel display without provision of the backlight, is advantageous in enlarging the viewing angle by the spontaneous light emission function of the organic EL display. The organic EL panel display is also able to reduce the power consumption still more because of its operational characteristic of lighting up only necessary pixels, and it may considered to ensure the responsivity sufficient to keep up with the above-described high definition and high speed video signal.

As an essential element of the organic EL display having the above advantages, there has been known an organic electroluminescence element having the following structure. An electrode layer patterned into stripes (anodes), formed of a transparent conductive film, is formed on a transparent substrate. An organic electroluminescence layer patterned into stripes is formed on the transparent electrode layer, and an electrode layer patterned into stripes (cathodes), formed of a metal thin film, is formed on the organic electroluminescence layer. That is to say, in this structure, the organic electroluminescence layer is held between the transparent electrode layer and the metal electrode layer, and the stripes of the transparent electrode layer and the metal electrode layer are crossed to each other to form a matrix structure.

When a voltage is applied to selected one of the stripes of the transparent electrode layer and selected one of the stripes of the metal electrode layer, a current is allowed to flow in the associated one of the stripes of the organic electroluminescence layer, to make luminous the associated pixel.

The materials used for forming the organic electroluminescence layer are classified into a high molecular material formed by polymerizing a monomer, and a low molecular material. In the case of forming the organic electroluminescence layer using a low molecular material, a film of the low molecular material is formed by vacuum vapor-deposition. On the contrary, a film of a high molecular material cannot be formed by vacuum vapor-deposition, and therefore, in the case of forming the organic electroluminescence layer using a high molecular material, a film of the high molecular material is formed by painting a solution containing the high molecular material.

Various studies have been made in regard to the above-described organic electroluminescence layer made from a low molecular material. For example, C. W. Tang, S. A. VanSlyke, and others have developed a so-called single hetero type organic electroluminescence layer of a double layered structure including a thin film made from an organic compound having a positive hole transfer characteristic and a thin film made from an organic compound having an electron transfer characteristic, whereby positive holes and electrons injected in respective thin films from an anode and a cathode are re-combined with each other to cause light emission (Applied Physics letters, Vol. 51, No. 12, pp. 913–915, 1987). In this organic electroluminescence layer, the organic compound having the positive hole transfer characteristic or the organic compound having the electron transfer characteristic serves as an electroluminescence material, in which light emission occurs in a wavelength band corresponding to an energy gap between a base state and an excited state of the electroluminescence material. The organic electroluminescence layer of the double layered structure was effective to significantly reduce the drive voltage and to improve the luminous efficiency. After that, C. Adachi, S. Tokita, T. Tsutsui, S. Saito, and others have developed a so-called double hetero type organic electroluminescence layer of a three-layered structure including a thin film made from an organic compound having the positive hole transfer characteristic, a thin film made from an organic compound having an electroluminescence characteristic, and a thin film made from an organic compound having the electron transfer characteristic (Japanese Journal of Applied Physics, Vol. 27, No. 2, pp. L269–L271, 1988). Further, C. W. Tang, S. A. VanSlyke, C. H. Chen, and others have developed a structure in which an electroluminescence material is contained in an organic compound having the electron transfer characteristic (Journal of Applied Physics, Vol. 65, No. 9, pp. 3610–3616).

In an organic electroluminescence element having either of the above-described organic electroluminescence layers, however, since the metal electrode layer has a thickness of several hundreds nm or more and thereby light is specularly reflected from the metal electrode layer, there arises a problem in that it fails to obtain a sufficient contrast.

To solve such a problem, a method has been examined of reducing the reflection of light from the back side of the metal electrode layer by using a circular polarization sheet or coloring the transparent substrate; however, even in accordance with the method, a desired contrast cannot be obtained yet.

SUMMARY OF THE INVENTION

An object of the present invention is to provide an organic electroluminescence element capable of reducing reflection of light from a metal electrode layer, thereby ensuring a sufficiently high display contrast in the case where the element is used for a display.

To achieve the above object, according to a first aspect of the present invention, there is provided an organic electroluminescence element including: a first electrode layer; an organic electroluminescence layer formed adjacent to one surface of the first electrode layer; and a second electrode layer formed adjacent to the other surface of the organic luminescence layer, the second electrode layer having an optical reflectance to visible light specified in a range of 50% or less. The above optical reflectance can be set at a value in a specific range by adjusting the thickness of the second electrode layer.

With this configuration, since the second electrode layer formed adjacent to the other surface of the organic electroluminescence layer has an optical reflectance to visible light specified in the range of 50% or less, a display using such an element is able to display an image with a desirable contrast.

According to a second aspect of the present invention, there is provided an organic luminescence element including: a first electrode layer; an organic electroluminescence layer formed adjacent to one surface of the first electrode layer; a second electrode layer formed adjacent to the other surface of the organic electroluminescence layer, the second electrode layer having an optical reflectance to visible light specified in a range of 50% or less; and a low optical reflection layer formed on the second electrode layer on the opposed side to the surface adjacent to the organic electroluminescence layer. In this element, the low optical reflection layer is preferably composed of at least one or more layers including a layer having an optical reflectance to visible light specified in a range of 10% or less.

With this configuration, the second electrode layer has an optical reflectance to visible light specified in the range of 50% or less and also the low optical reflection layer having an optical reflectance specified, preferably, in the range of 10% or less is formed on the second electrode layer on the opposed side to the surface adjacent to the organic electroluminescence layer, a display using such an element is able to display an image with a desirable contrast.

According to a third aspect of the present invention, there is provided an organic electroluminescence element including: a first electrode layer; an organic electroluminescence layer formed adjacent to one surface of the first electrode layer; a second electrode layer formed adjacent to the other surface of the organic electroluminescence layer, the second electrode layer having an optical reflectance to visible light specified in a range of 50% or less; and a conductive layer formed on the second electrode layer on the opposed side to the surface adjacent to the organic electroluminescence layer in such a manner as to be in close-contact therewith and to have a shape along the surface of the second electrode layer, the conductive layer constituting an electrode portion in combination with the second electrode layer. In this element, the optical reflectance to visible light of the conductive layer is preferably in a range of 60% or less, more preferably, 50% or less.

With this configuration, since the second electrode has an optical reflection to visible light specified in the range of 50% or less and also the conductive layer is formed on the second electrode layer on the opposed side to the surface adjacent to the organic electroluminescence layer, a display using such an element is able to display an image with a desirable contrast.

DETAILED DESCRIPTION OF THE PREFERRED EMBODIMENTS

Hereinafter, preferred embodiments of the present invention will be described in detail with reference to the accompanying drawings.

<First Embodiment>

Figure 1:
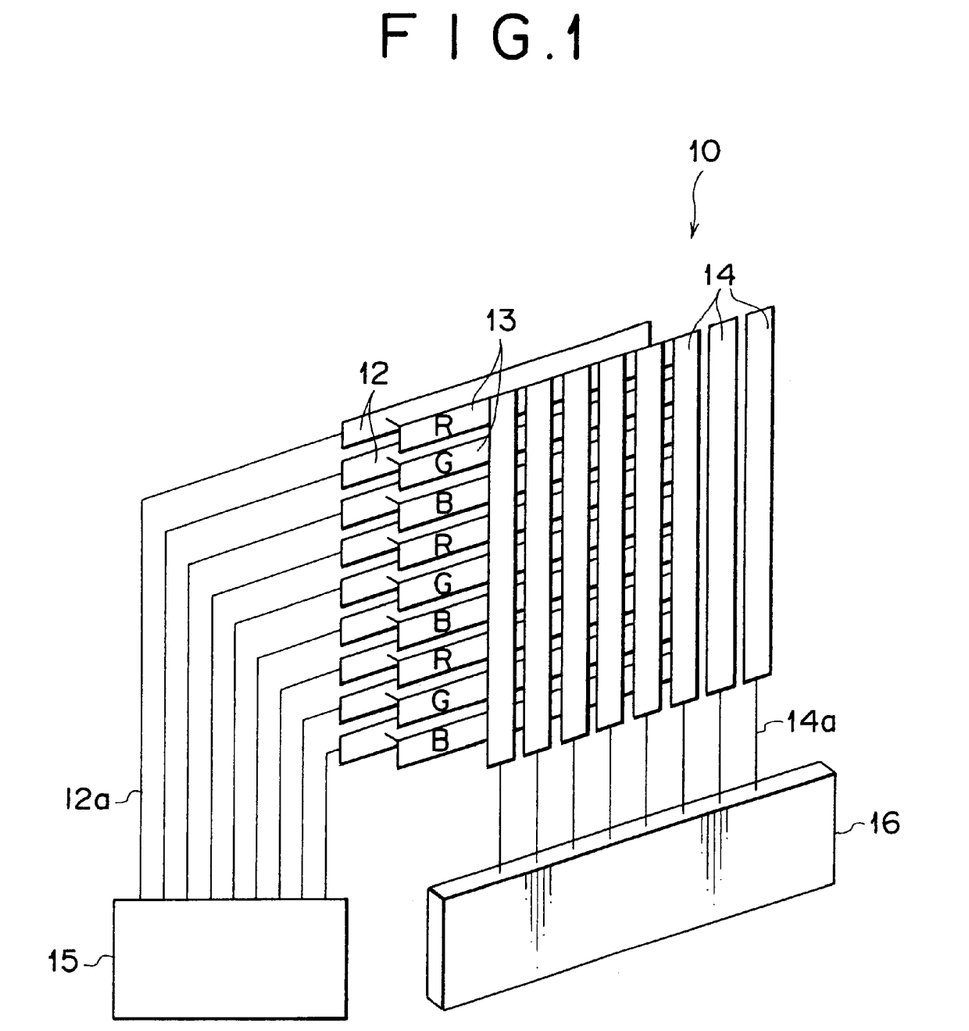
FIG. 1 is a schematic perspective view showing a configuration of a flat panel display including an organic electroluminescence element according to a first embodiment of the present invention.
Figure 2:
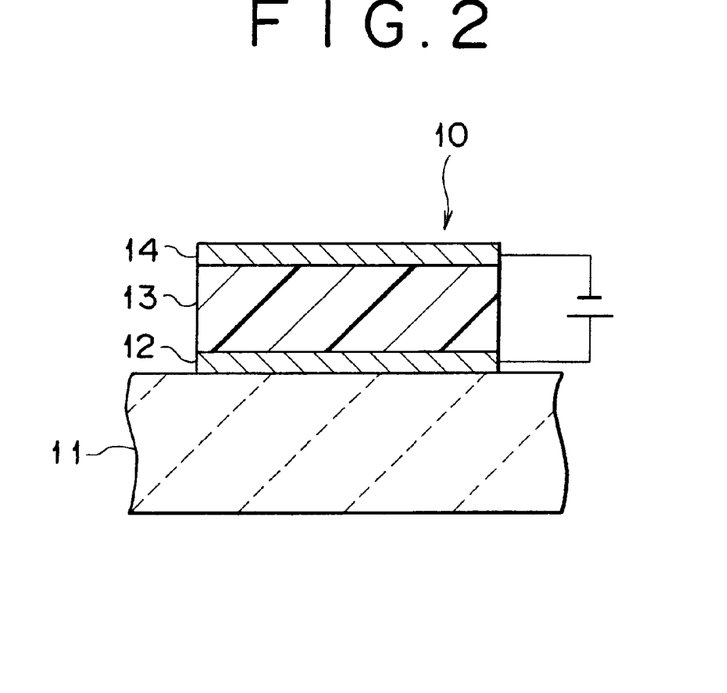
FIG. 2 is a sectional view showing a structure of the organic electroluminescence element according to the first embodiment.

FIG. 1 is a schematic view showing a configuration of an essential portion of a flat panel display including an organic electroluminescence element 10 according to a first embodiment of the present invention, and FIG. 2 is a sectional view showing a cross-sectional structure of the organic electroluminescence element 10.

The structure of the organic electroluminescence element 10 will be described below. A transparent electrode layer 12 made from ITO (Indium Tin Oxide) or tin oxide ($SnO_2$) is formed on a transparent substrate 11 made from glass or plastic in such a manner that the layer 12 is patterned into a plurality of equally-spaced stripes. An organic electroluminescence layer 13 is formed on the transparent electrode layer 12 in such a manner as to be patterned into a plurality of equally-spaced stripes. It should be noted that the transparent electrode layer 12 corresponds to the first electrode layer of the present invention.

The organic electroluminescence layer 13 is typically composed of a positive hole transfer layer, an electroluminescence layer, and an electron transfer layer which are stacked on the transparent electrode layer 12 in this order. The positive hole transfer layer is made from a known material such as an aromatic amine ($R-NH_2$) or pyrazoline ($C_3H_6N_2$). The electroluminescence layer is made from a suitable material capable of emitting light of an objective color, which material may be selected from fluorescent compounds including a coumarin based pigment, a styryl based pigment, a oxazine based pigment, a xanthene based pigment, a rare earth complex, perilene, and fluorene. The electron transfer layer is made from either of a complex compound of a metal such as aluminum (Al) or zinc (Zn), an aromatic carbon compound, and an oxadiazole based compound.

The organic electroluminescence layer 13 may be composed of only an electroluminescence layer made from 9,10-bis[4-(N,N'-diphenylamino)] styrylanthracene or polyparapheylene vinylene; or may be composed of a stacked body having a positive hole transfer layer and an electron transfer layer wherein at least one of these layers has a luminous characteristic. The organic electroluminescence layer 13 may be composed of a stacked body having a positive hole transfer layer and an electron transfer layer wherein a fluorescent material is added to at least one of these layers. Further, to improve the luminous efficiency, the organic electroluminescence layer 13 may include a thin film for controlling the transfer of positive holes or electrons, in addition to the above-described positive hole transfer layer, electroluminescence layer, and electron transfer layer. In addition, the positive hole transfer layer may be of a stacked structure for improving an electric charge transfer performance.

The organic electroluminescence layer 13 may be configured such that the equally-spaced stripes thereof are alternately colored into red (R), green (G), and blue (B). The element including such an organic electroluminescence layer 13 can realize a multi-color or full-color type complete-solid flat panel display. The example shown in FIG. 1 is a simple matrix display having a configuration of 8×3 RGB.

A metal electrode layer 14 is stacked on the organic electroluminescence layer 13 in such a manner as to be patterned into equally-spaced stripes each having the same width as that of each stripe of the organic electroluminescence layer 13. The metal electrode layer 14 is configured to have an optical reflectance to visible light (wavelength: about 390 to 760 nm) specified in a range of 50% or less, preferably, 30% or less. The metal electrode layer 14 is made from an active metal such as lithium (Li), magnesium (Mg), or calcium (Ca); or an alloy containing one kind selected from the active metals and a metal such as silver (Ag), aluminum (Al) or indium (In), for example, a Mg—Ag alloy containing magnesium and silver at a mixing ratio in weight of Mg:Ag=30:1. In this embodiment, the optical reflectance of the metal electrode layer 14 is controlled by making use of the fact that the optical reflectance of a metal thin film is dependent on the thickness of the metal thin film. To be more specific, as the thickness of the metal electrode layer 14 becomes thinner, the optical reflectance to visible light becomes smaller. For example, if the metal electrode layer 14 is made from the Mg—Ag alloy having the mixing ratio in weight of Mg:Ag=30:1, the optical reflectance of the layer 14 is 50% when the thickness of the layer 14 is 200 nm, and is 30% when the thickness of the layer 14 is 10 nm. It should be noted that the metal electrode layer 14 corresponds to the second electrode layer of the present invention.

Referring to FIG. 1, each stripe of the transparent electrode layer 12 is electrically connected via a wire 12a to a control circuit 15 containing a shift register, and each stripe of the metal electrode layer 14 is electrically connected via a wire 14a to a control circuit 16 containing a shift register.

A method of manufacturing the organic electroluminescence element 10 will be described below.

First, an ITO film or a tin oxide film having a thickness of 200 nm is formed on a transparent substrate 11 made from glass or plastic by sputtering or vapor-deposition, and is then anisotropically etched by wet-etching or RIE (Reactive Ion Etching), to form a transparent electrode layer 12 patterned into a plurality of equally-spaced stripes.

An organic electroluminescence layer 13 is formed on the transparent electrode layer 12 provided on the transparent substrate 11 in such a manner as to be patterned into a plurality of stripes having the same width. To be more specific, the organic electroluminescence layer 13 is formed by stacking a positive hole transfer layer having a thickness of 50 nm, an electroluminescence layer having a thickness of 20 nm, and an electron transfer layer having a thickness of 50 nm using the suitable materials described above on the transparent electrode layer 12 in this order by vacuum vapor-deposition.

Then, a metal electrode layer 14 having a thickness ranging from 10 to 15 nm is formed from the above Mg—Ag alloy containing magnesium and silver at the mixing ratio in weight of Mg:Ag=30:1 on the organic electroluminescence layer 13 by either of vacuum vapor-deposition, sputtering, and CVD (Chemical Vapor Deposition). The metal electrode layer 14 is patterned into a plurality of stripes each having the same width as that of each stripe of the organic electroluminescence layer 13.

In the organic electroluminescence element 10, a specific signal voltage is applied in time series between the stripes of the transparent electrode layer 12 and the metal electrode layer 14 by the control circuits 15 and 16, so that a current is injected in the associated stripe of the organic electroluminescence layer 13 from the metal electrode layer 14 side. In the organic electroluminescence layer 13, positive holes and electrons injected from the transparent electrode layer 12 and the metal electrode layer 14 are transferred to the electroluminescence layer via the positive hole transfer layer and the electron transfer layer, respectively and are re-combined with each other, to cause light emission, and the light thus emitted is taken out in the direction perpendicular to the principal plane of the transparent substrate 11.

In this embodiment, the metal electrode layer 14 has an optical reflectance to visible light specified in the range of 50% or less, preferably, 30% or less, and accordingly, the specular reflection of light from the metal electrode layer 14 is significantly reduced.

In this way, according to the organic electroluminescence element 10 in this embodiment, since the optical reflectance to visible light of the metal electrode layer 14 is set at a value in the range of 50% or less by adjusting the thickness of the metal electrode layer 14, it is possible to significantly reduce the specular reflection of light from the metal electrode layer 14.

<Second Embodiment>

Figure 3:
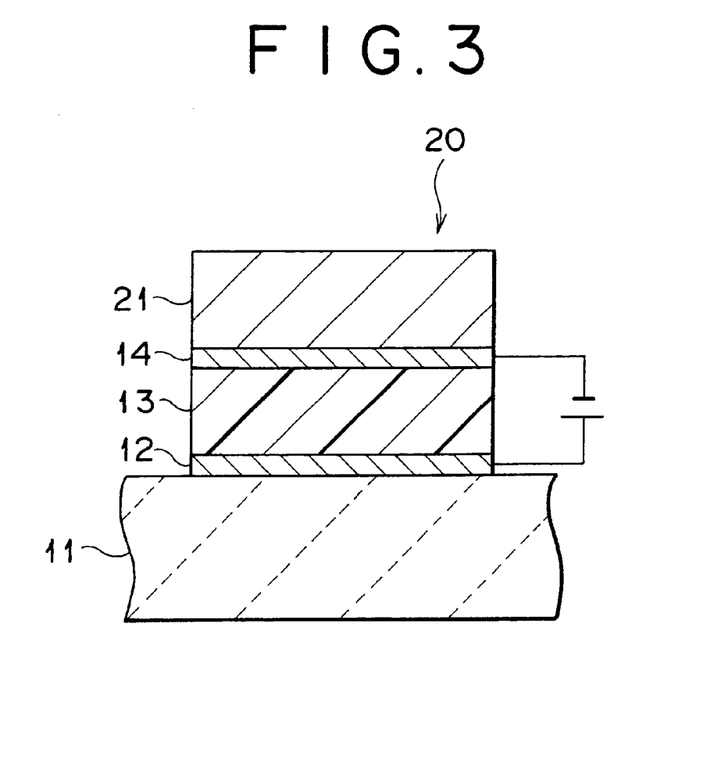
FIG. 3 is a sectional view showing a structure of an organic electroluminescence element according to a second embodiment of the present invention.

FIG. 3 is a schematic sectional view showing a cross-sectional structure of an organic electroluminescence element 20 according to a second embodiment of the present invention. The organic electroluminescence element 20 has the same configuration as that of the element 10 in the first embodiment except that a low optical reflection layer 21 is formed on the metal electrode layer 14 in the first embodiment. In this embodiment, therefore, parts corresponding to those in the first embodiment are designated by the same reference numerals as those in the first embodiment and the detailed explanation thereof is omitted.

The low optical reflection layer 21, which is formed over the entire surfaces of the stripes of the metal electrode layer 14, includes a first layer having a thickness of 200 nm and a second layer having a thickness of 10 μm stacked on the first layer. The first layer is made from either of silicon nitride ($SiN_x$), calcium fluoride ($CaF_2$), magnesium fluoride ($MgF_2$), silicon monoxide (SiO), silicon dioxide ($SiO_2$), zinc sulfide (ZnS) and sodium hexafluoroaluminum ($Na_3AlF_6$). The second layer is made from an organic compound or black paint formed by dispersing carbon black or aniline black in a high polymer binder such as a cellulose based. In addition, the low optical reflection layer 21 may be composed of at least one or more layers including a layer having an optical reflectance to visible light specified in a range of 10% or less, and at least part of the low optical reflection layer 21 may be in contact with the metal electrode layer 14. Further, the low optical reflection layer 21 may be made from a material capable of satisfying the above-described optical characteristic, and the layer having the optical reflectance to visible light specified in the range of 10% or less is made from an organic compound formed by dispersing a dye such as carbon black or a pigment such as aniline black in a high polymer binder such as a cellulose based resin.

A method of manufacturing the organic electroluminescence element 20 will be described below. In addition, the detailed explanation of the same steps as those in the first embodiment is omitted.

First, a transparent electrode layer 12, an organic electroluminescence layer 13 and a metal electrode layer 14 are sequentially formed on a transparent substrate 11.

Then, a layer made from either of silicon nitride, calcium fluoride, magnesium fluoride, silicon monoxide, silicon dioxide, zinc sulfide, and sodium hexafluoroaluminum and having a thickness of 200 nm is formed on the metal electrode layer 14 by vacuum vapor-deposition, and then an organic compound or black paint formed by dispersing carbon black or aniline black in a high polymer binder such as a cellulose based resin is painted on the above layer to a thickness of 10 $\mu$m, to thus form the low optical reflection layer 21.

The function of the organic electroluminescence element 20 will be described below.

In the organic electroluminescence element 20, when a specific voltage is applied between selected one of the stripes of the transparent electrode layer 12 and selected one of the stripes of the metal electrode layer 14, a current is injected to the associated stripe of the organic electroluminescence layer 13 from the metal electrode layer 14 side. In the organic electroluminescence layer 13, positive holes and electrons injected from the transparent electrode layer 12 and the metal electrode layer 14 are transferred to the electroluminescence layer via the positive hole transfer layer and the electron transfer layer, respectively and are re-combined with each other, to cause light emission, and the light thus emitted is taken out in the direction perpendicular to the principal plane of the transparent substrate 11. According to this embodiment, since the metal electrode layer 14 has an optical reflectance to visible light specified in the range of 50% or less and also the low optical reflection layer 21 including the layer having the optical reflectance to visible light specified in the range of 10% or less is provided over the entire surfaces of the stripes of the metal electrode layer 14, the specular reflection of light from the metal electrode layer 14 is significantly reduced.

In this way, according to the organic electroluminescence element 20 in this embodiment, since the low optical reflection layer 21 including the layer having the optical reflectance of 10% or less is provided on the metal electrode layer 14 having the optical reflectance of 50% or less, it is possible to suppress the specular reflection of light from the metal electrode layer 14 more significantly than that in the first embodiment.

<Third Embodiment>

Figure 4:
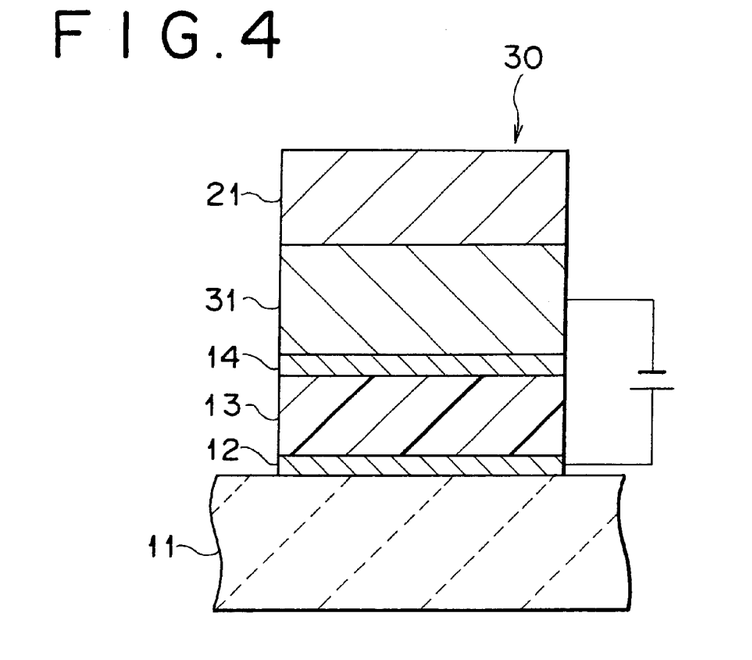
FIG. 4 is a sectional view showing a structure of an organic electroluminescence element according to a third embodiment of the present invention.

FIG. 4 is a schematic sectional view showing a cross-sectional view of an organic electroluminescence element 30 according to a third embodiment of the present invention. The organic electroluminescence element 30 has the same configuration as that of the second embodiment except that a transparent conductive layer 31 is provided between the metal electrode layer 14 and the low optical reflection layer 21 in the second embodiment. In this embodiment, therefore, parts corresponding to those in the second embodiment are designated by the same reference numerals as those in the second embodiment, and the detailed explanation thereof is omitted. It should be noted that the transparent conductive layer 31 corresponds to the conductive layer of the present invention.

The transparent conductive layer 31 has an optical reflectance to visible light specified in a range of 10% or less, and is formed over the entire surfaces of the stripes of the metal electrode layer 14. The transparent conductive layer 31 is made from an oxide such as ITO (Indium Tin Oxide), a zinc oxide-indium oxide based complex oxide, or $SnO_2$; or a high polymer material formed by polymerizing either of aniline ($C_6H_5NH_2$), thiophene ($C_4H_4S$) and acetylene ($C_2H_2$). The thickness of the transparent conductive layer 31 is set at 300 nm. In addition, at least part of the transparent conductive layer 31 may be in contact with the metal electrode layer 14.

A method of manufacturing the organic electroluminescence element 30 will be described below. The detail description of the same steps as those in the second embodiment is omitted.

In this embodiment, like the first embodiment, a transparent electrode layer 12, an organic electroluminescence layer 13, and a metal electrode layer 14 are sequentially formed on a transparent substrate 11, and a transparent conductive layer 31 is formed on the stripes of the metal electrode layer 14 to a thickness of 300 nm by sputtering or vapor-deposition. The transparent conductive layer 31 is made from an oxide such as ITO (Indium Tin Oxide), a zinc oxide-indium oxide based complex oxide, or $SnO_2$; or a high polymer material formed by polymerizing either of aniline ($C_6H_5NH_2$), thiophene ($C_4H_4S$) and acetylene ($C_2H_2$). Then, a low optical reflection layer 21 is formed on the stripes of the transparent conductive layer 31.

In the organic electroluminescence element 30, when a specific voltage is applied between selected one of the stripes of the transparent electrode layer 12 and selected one of the stripes of the transparent conductive layer 31, a current is injected to the associated one of the stripes of the organic electroluminescence layer 13 from the side of both the transparent conductive layer 31 and the metal electrode layer 14. In the layer 13, positive holes and electrons injected from the transparent electrode layer 12 and the transparent conductive layer 31 are transferred to the electroluminescence layer via the positive hole transfer layer and both the metal electrode layer 14 and the electron transfer layer, respectively and are re-combined with each other, to cause light emission, and the light thus emitted is taken out in the direction perpendicular to the principal plane of the transparent substrate 11. According to such an organic electroluminescence element 30, since the metal electrode layer 14 has an optical reflectance to visible light specified in the range of 50% or less and also the transparent conductive layer 31 having an optical reflectance in the range of 10% or less and the low optical reflection layer 21 including the layer having an optical reflectance in the range of 10% or less are formed over the entire surfaces of the stripes of the metal electrode layer 14, the specular reflection of light from the metal electrode layer 14 is significantly reduced.

In this way, according to the organic electroluminescence element 30 in this embodiment, since the transparent conductive layer 31 having an optical reflectance in the range of 10% or less and the low optical reflection layer 21 including the layer having an optical reflectance in the range of 10% or less are provided on the metal electrode layer 14 having an optical reflectance in the range of 50% or less, it is possible to suppress the specular reflection of light from the metal electrode layer 14 more significantly than that in the second embodiment.

In the first and second embodiments, the thickness of the metal electrode layer 14 is made thinner than that in the related art element to make the optical reflectance thereof smaller than that in the related art element, and therefore, a current passing area of the metal electrode layer 14 is made correspondingly narrower than that in the related art element. On the contrary, in this embodiment, since the transparent conductive layer 31 is provided adjacent to the thin metal electrode layer 14, to constitute an electrode portion in combination with the metal electrode layer 14, the current passing area is substantially enlarged. As a result, by applying a voltage between the transparent electrode layer 12 and the transparent conductive layer 31, a current can be injected in the organic electroluminescence layer 13 easier than in the first and second embodiments, to thereby improve the luminous efficiency.

<Fourth Embodiment>

Figure 5:
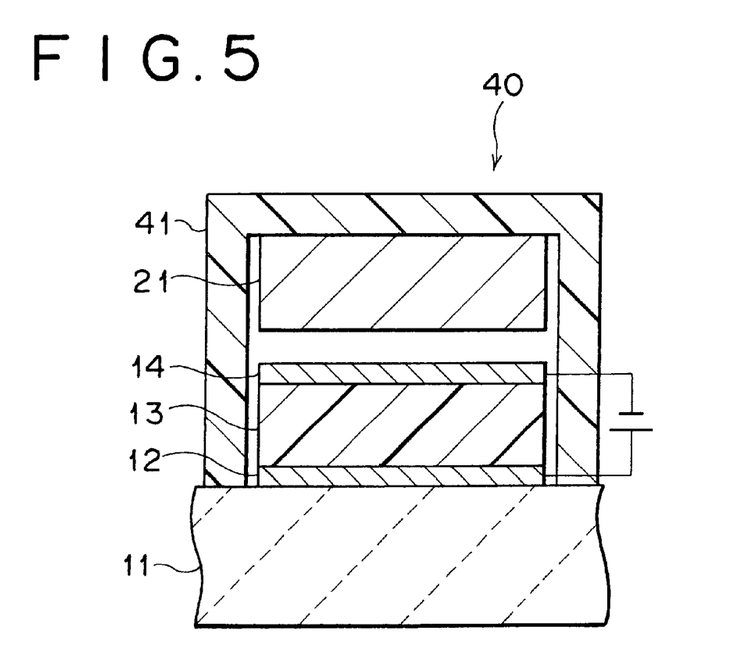
FIG. 5 is a sectional view showing a structure of an organic electroluminescence element according to a fourth embodiment of the present invention.

FIG. 5 is a schematic sectional view showing a cross-sectional structure of an organic electroluminescence element 40 according to a fourth embodiment of the present invention. In this organic electroluminescence element 40, like the second embodiment, a transparent electrode layer 12, an organic electroluminescence layer 13, a metal electrode layer 14, and a low optical reflection layer 21 are sequentially formed on a transparent substrate 11; however, unlike the second embodiment, these layers 12, 13, 14 and 21 are covered with a sealing vessel 41 adhesively bonded on the surface of the transparent substrate 11. The sealing vessel 41 is made from a stainless steel. In this embodiment, the low optical reflection layer 21 is adhesively bonded on a ceiling surface of the sealing vessel 41 and is not in contact with the metal electrode layer 14. An inner wall of the sealing vessel 41 is coated with a paint containing carbon black. The sealing vessel 41 is adhesively bonded to the transparent substrate 11 with an ultraviolet hardening-type resin, to enclose the interior of the sealing vessel 41. The organic electroluminescence layer 13, the transparent electrode layer 12 and the metal electrode layer 14 are shielded from oxygen, moisture and the like in atmospheric air by the sealing vessel 41.

The low optical reflection layer 21 may be configured such that the sealing vessel is made from either of a metal, ceramic, and plastic material, and a paint formed by dispersing a pigment or dye in a suitable binder in such an amount as to ensure an optical reflectance specified in a range of 10% or less may be applied on the sealing vessel itself.

This embodiment has the same configuration as that of the second embodiment except for the above-described points, and therefore, parts corresponding to those in the second embodiment are designated by the same reference numerals as those in the second embodiment, and the detailed explanation thereof is omitted.

In this embodiment, the low optical reflection layer 21 is adhesively bonded on the ceiling surface of the sealing vessel 41, and the sealing vessel 41 is adhesively bonded, by means of an ultraviolet hardening-type resin, on the transparent substrate 11 on which the transparent electrode layer 12, the organic electroluminescence layer 13 and the metal electrode layer 14 are sequentially stacked, to enclose the interior of the sealing vessel 41.

In the organic electroluminescence element 40, like the second embodiment, a specific voltage is applied between selected one of the stripes of the transparent electrode layer 12 and selected one of the stripes of the metal electrode layer 14, a current is injected in the associated one of the stripes of the organic electroluminescence layer 13 from the metal electrode layer 14 side. In the organic electroluminescence layer 13, positive holes and electrons injected from the transparent electrode layer 12 and the metal electrode layer 14 are transferred to the electroluminescence layer via the positive hole transfer layer and the electron transfer layer, respectively and are re-combined with each other, to cause light emission, and the light thus emitted is taken out in the direction perpendicular to the principal plane of the transparent substrate 11.

Even in the organic electroluminescence element 40 according to this embodiment, since the metal electrode layer 14 has an optical reflectance to visible light specified in the range of 50% or less, and also the low optical reflection layer 21 including the layer having an optical reflectance to visible light specified in the range of 10% or less is provided on the metal electrode layer 14, the specular reflection of light from the metal electrode layer 14 is significantly reduced. In this embodiment, while the metal electrode layer 14 is separated a specific distance from the low optical reflection layer 21, the function and effect of these layers 14 and 21 are the same as those of the layers 14 and 21 which are entirely or partially contact with each other.

In this embodiment, since the transparent electrode layer 12, the organic electroluminescence layer 13, and the metal electrode layer 14 are all covered with the sealing vessel 41, they can be shielded from oxygen, moisture and the like in atmospheric air. With this configuration, the service life of the organic electroluminescence element 40, which has been regarded as being weak in moisture, can be prolonged.

<Fifth Embodiment>

Figure 6:
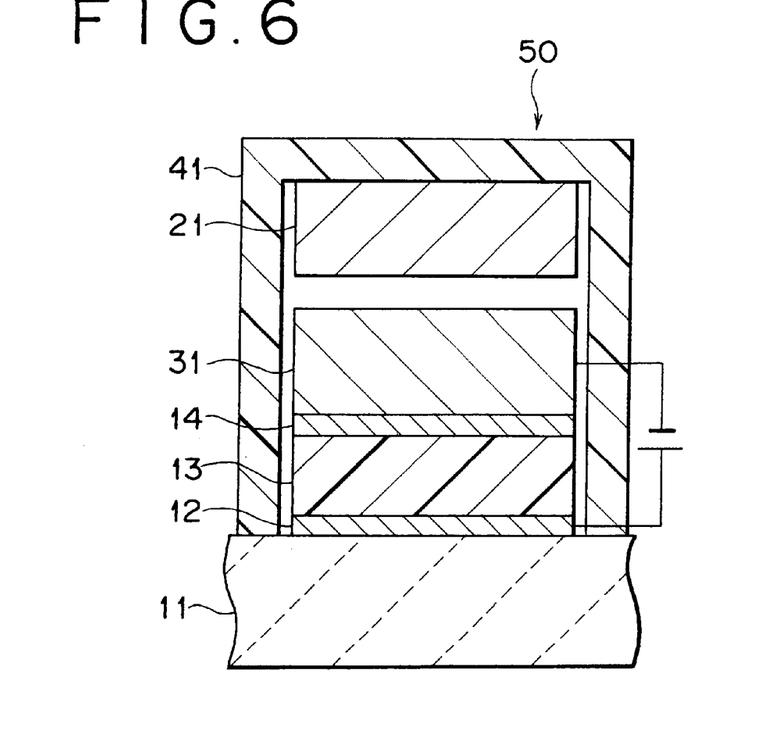
FIG. 6 is a sectional view showing a structure of an organic electroluminescence element according to a fifth embodiment of the present invention.

FIG. 6 is a schematic sectional view showing a cross-sectional structure of an organic electroluminescence element 50 according to a fifth embodiment of the present invention. The organic electroluminescence element 50 has the same configuration as that of the element 40 in the fourth embodiment except that a transparent conductive layer 31 is formed on the metal electrode layer 14. In this embodiment, therefore, parts corresponding to those in the fourth embodiment are designated by the same reference numerals as those in the fourth embodiment, and the detailed explanation thereof is omitted.

In the organic electroluminescence element 50 according to this embodiment, since the low optical reflection layer 21 including the layer having an optical reflectance to visible light specified in the range of 10% or less is provided on the metal electrode layer 14 having an optical reflectance to visible light specified in the range of 50% or less, and also the transparent conductive layer is provided between the metal electrode layer 14 and the low optical reflection layer 21, the specular reflection of light from the metal electrode layer 14 can be significantly reduced, and since the current passing area is enlarged by addition of the transparent conductive layer 31 to the metal electrode layer 14, the luminous efficiency can be improved. The other effects are the same as those obtained in the fourth embodiment.

<Sixth Embodiment>

Figure 7:
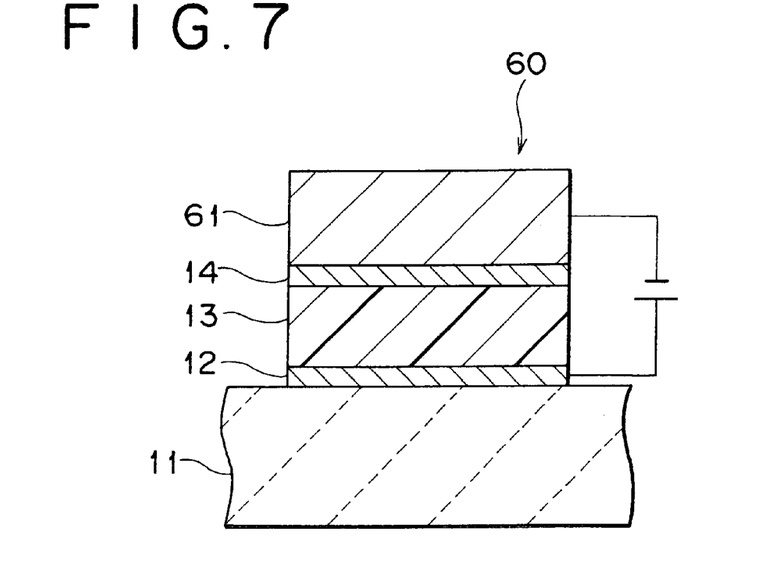
FIG. 7 is a sectional view showing a structure of an organic electroluminescence element according to a sixth embodiment of the present invention.

FIG. 7 is a schematic view showing a cross-sectional structure of an organic electroluminescence element 60 according to a sixth embodiment of the present invention. The organic electroluminescence element 60 has the same configuration as that of the first embodiment expect that a conductive layer 61 is provided adjacent to the metal electrode layer 14 in the first embodiment, to substantially increase the thickness of the metal electrode layer 14 as compared with the element in the first embodiment. In this embodiment, therefore, parts corresponding to those in the first embodiment are designated by the same reference numerals as those in the first embodiment, and the detailed explanation thereof is omitted.

The conductive layer 61 has an optical reflectance to visible light specified in a range of 60% or less, preferably, 50% or less, and is formed in close-contact with the metal electrode layer 14. The conductive layer 61 is patterned into a plurality of stripes having shapes along upper surfaces of the stripes of the metal electrode layer 14. The conductive layer 61 is made from either of beryllium (Be), copper (Cu), chromium (Cr), iron (Fe), molybdenum (Mo), nickel (Ni), platinum (Pt), tungsten (W), lead (Pb), tin (Sn), antimony (Sb), strontium (St), and titanium (Ti). The thickness of the conductive layer 61 is set at 200 nm. In addition, the conductive layer 61 may be made from an alloy of the above metals, or may be made from silicon carbide (SiC), or a high polymer material formed by polymerizing either of aniline, thiophene, and acetylene.

In the organic electroluminescence element 60, like the first embodiment, a transparent electrode layer 12, an organic electroluminescence layer 13, and a metal electrode layer 14 are sequentially formed on a transparent substrate 11, and then a film of the above material is formed on the stripes of the metal electrode layer 14 by vacuum vapor-deposition, to form the conductive layer 61 having a thickness of 200 nm.

In the organic electroluminescence element 60, when a specific voltage is applied between selected one of the stripes of the transparent electrode layer 12 and selected one of the stripes of the conductive layer 61, a current is injected in the organic electroluminescence layer 13 from the conductive layer 61 side. In the organic electroluminescence layer 13, positive holes and electrons injected from the transparent electrode layer 12 and the conductive layer 61 are transferred to an electroluminescence layer via a positive hole transfer layer and an electron transfer layer, respectively and are re-combined with each other, to cause light emission, and the light thus emitted is taken out in the direction perpendicular to the principal plane of the transparent substrate 11. According to this embodiment, since the metal electrode layer 14 has the optical reflectance to visible light specified in the range of 50% or less and also the conductive layer 61 having an optical reflectance to visible light specified in the range of 60% or less is provided on the metal electrode layer 14 in such a manner as to be close-contact therewith, the specular reflection of light from the metal electrode layer 14 is reduced.

In this way, according to the organic electroluminescence element 60 in this embodiment, since the conductive layer 61 having an optical reflectance in the range of 60% or less is provided in such a manner as to be in close-contact with the metal electrode layer 14 having an optical reflectance in the range of 50% or less, the specular reflection of light from the metal electrode layer 14 can be reduced, and since the current passing area is increased by addition of the conductive layer 61 to the metal electrode layer 14 as compared with the element in the first embodiment, to thereby improve the luminous efficiency.

The present invention will be more clearly understood by way of the following examples.

FIRST EXAMPLE

In this example, first, there was prepared a transparent substrate (sheet resistance: 10 Ω/cm$^2$) made from glass, on which a transparent electrode layer having a pattern of stripes was previously formed from ITO (Indium Tin Oxide) film to a thickness of 200 nm. Then, a vapor-deposition mask having openings formed in its region corresponding to a film forming portion was inserted between the transparent electrode layer and a vapor-deposition source in a vacuum vapor-deposition system, and an organic electroluminescence layer having a pattern of stripes was formed on the stripes of the transparent electrode layer under a vacuum of $10^{-6}$ Torr or less. Specifically, TPD [N,N'-diphenyl-N,N'-bis (3-methylphenyl) 1,1'-biphenyl-4,4'-diamine] expressed by the following chemical formula 1 was evaporated at an evaporation rate ranging from 0.2 to 0.4 nm/s by resistance heating to form a positive hole transfer layer having a thickness of 50 nm, and Alq [tris-(8-hydroxyquinoline) aluminum] expressed by the following chemical formula 2 was evaporated at an evaporation rate ranging from 0.2 to 0.4 nm/s by resistance heating to form an electron transfer layer having a thickness of 50 nm on the positive hole transfer layer in such a manner as to be in close-contact therewith. The above material Alq is an organic compound which is capable of emitting light of green, and which exhibits both an electron transfer characteristic and an electroluminescence characteristic.

chemical formula 1 chemical formula 2

Then, a metal electrode layer having a pattern of stripes was formed from a Mg—Ag alloy containing magnesium and silver at a mixing ratio in weight of Mg:Ag=30:1 on the stripes of the organic electroluminescence layer to a thickness ranging from 10 to 15 nm by vacuum vapor-deposition. As a result of measurement of an optical reflectance to visible light of the Mg—Ag alloy film, the optical reflectance was 30% for the Mg—Ag film having a thickness of 10 nm. For comparison, the optical reflectance of the Mg—Ag alloy film having a thickness of 40 nm was measured, with a result that the optical reflectance was 80% or more.

Then, a low optical reflection layer having a pattern of stripes was formed on the stripes of the metal electrode layer. To be more specific, a film of sodium hexafluoroaluminum ($Na_3AlF_6$) having a thickness of 200 nm was formed on the metal electrode layer by vacuum vapor-deposition using a tungsten boat as a vapor-deposition boat, and a black paint formed by dispersing carbon black in a cellulose resin was applied to the film of sodium hexafluoroaluminum to a thickness of 10 μm, to thus obtain the low optical reflection layer. In this way, an organic electroluminescence element was obtained. In addition, the optical reflectance to visible light of the black paint was 5%.

The organic electroluminescence element thus obtained was evaluated in electroluminescence in a glove box filled with argon (Ar) gas. As a result, when being driven at a drive voltage of 10 V and a current density of 10 mA/cm$^2$, the organic electroluminescence element emitted light of green and exhibited a luminance of about 500 cd/cm$^2$. Further, the optical reflectance to visible light of the organic electroluminescence element was about 35%.

As a comparative example, an organic electroluminescence element was formed in the same manner as that in this inventive example except that the thickness of the Mg—Ag alloy film, that is, the metal electrode layer was changed into 200 nm. The organic electroluminescence element was evaluated in electroluminescence in the same manner as that in this inventive example. As a result, the optical reflectance to visible light of the organic electroluminescence element was about 80%, and the display contrast of an organic EL display using the organic electroluminescence element was 5:1.

As the result of the above evaluation, it was revealed that the display contrast of the organic EL display using the organic electroluminescence element in this inventive example was as high as about 2.3 times that of the organic EL display using the organic electroluminescence element in the comparative example when compared at the same luminance.

SECOND EXAMPLE

In this example, first, there was prepared a transparent substrate (sheet resistance: 10 Ω/cm$^2$) made from glass, on which a transparent electrode layer having a pattern of stripes was previously formed from ITO (Indium Tin Oxide) film to a thickness of 200 nm. Then, an organic electroluminescence layer having a pattern of stripes and a metal electrode layer having a pattern of stripes were sequentially formed on the stripes of the transparent electrode layer in the same manner as that in the first example.

A transparent conductive layer having a pattern of stripes was formed from ITO film on the stripes of the metal electrode layer to a thickness of 300 nm by magnetron sputtering. To be more specific, a sample was put in a RF (Radio frequency) magnetron sputtering system with a base pressure adjusted at 5×10$^{-8}$ Torr or less, and the sample was mounted on a water-cooled type holding jig provided over a target (purity: 99 wt %) composed of 10 wt % of SnO$_2$ and 90 wt % of In$_2$O$_3$ (indium oxide) in such a manner as to be separated 15 cm therefrom. Then, RF discharge was performed using a mixed gas of argon (Ar) and oxygen (O$_2$) as a sputter gas. The flow rates of argon and oxygen were adjusted at 200 sccm and 0.1 sccm, respectively by a mass flow controller. At this time, the RF power was 5 W at a frequency of 13.56 MHz.

A low optical reflection layer having a pattern of stripes was then provided on the stripes of the transparent conductive layer by forming a thin film made from a mixture of perilene tetracarboxylate anhydride and copper phthalocyanine at a mixing ratio of 1:1 to a thickness of 500 nm by vacuum vapor-deposition. In this way, an organic electroluminescence element was obtained.

The organic electroluminescence element thus obtained was evaluated in electroluminescence in a glove box filled with argon gas. As a result, when being driven at a d rive voltage of 10 V and a current density of 10 mA/cm$^2$, the organic electroluminescence element emitted light of green and exhibited a luminance of about 460 cd/cm$^2$. Further, the optical reflectance to visible light of the organic electroluminescence element was about 37%.

As a comparative example, an organic electroluminescence element was formed in the same manner as that in this inventive example except that the thickness of the Mg—Ag alloy film, that is, the metal electrode layer was changed into 200 nm. The organic electroluminescence element was evaluated in electroluminescence in the same manner as that in this inventive example. As a result, the optical reflectance to visible light of the organic electroluminescence element was about 80%, and the display contrast of an organic EL display using the organic electroluminescence element was 5:1.

As the result of the above evaluation, it was revealed that the display contrast of the organic EL display using the organic electroluminescence element in this inventive example was as high as about 2.1 times that of the organic EL display using the organic electroluminescence element in the comparative example when compared at the same luminance.

THIRD EXAMPLE

In this example, first, there was prepared a transparent substrate made from a glass sheet having a size of 30 mm×30 mm, on which a transparent electrode layer was previously formed from ITO film to a thickness of 200 nm. The transparent electrode layer was then patterned into 8 stripes.

An organic electroluminescence layer having stripes for emission of light of green, stripes for emission of light of red, and stripes for emission of light of blue was formed on the transparent electrode layer in such a manner that the stripes of the organic electroluminescence layer are perpendicular to the stripes of the transparent electrode layer. In the stripes of the organic electroluminescence layer, the size of the electroluminescence area was set at 1 mm×1 mm and the pitch of the electroluminescence pixels was set at 1.2 mm. Then, a metal electrode layer 4 having a pattern of stripes was formed on the organic electroluminescence layer in such a manner that the stripes of the metal electrode layer were overlapped to the stripes of the organic electroluminescence layer. To be more specific, a vapor-deposition mask having three openings was inserted between the transparent electrode layer and a vapor-deposition source in a vacuum vapor-deposition system, and under a vacuum of about 10$^{-8}$ Torr, TPD was evaporated at an evaporation rate ranging from 0.2 to 0.4 nm/s by resistance heating to form a positive hole transfer layer having a thickness of 50 nm, and Alq was evaporated at an evaporation rate ranging from 0.2 to 0.4 nm/s by resistance heating to form an electron transfer layer having a thickness of 50 nm on the positive hole transfer layer in close-contact therewith, to thus form the stripes of the organic electroluminescence layer for emission of light of green.

Subsequently, a metal electrode layer having a pattern of stripes was formed from an Al—Li alloy film on the stripes of the organic electroluminescence layer for emission of light of green to a thickness of 10 nm by vacuum vapor-deposition in such a manner that the stripes of the metal electrode layer were overlapped on the stripes of the organic electroluminescence layer for emission of light of green. In addition, as a result of measurement of an optical reflectance to visible light of the Al—Li alloy film, the optical reflectance was about 30%.

Then, the vapor-deposition mask was replaced with a vapor-deposition mask having three openings extending perpendicularly to the stripes of the transparent electrode layer and formed in a region where the stripes of the organic electroluminescence layer for emission of light of green were not formed. Using such a vapor-deposition mask, the stripes of the organic electroluminescence layer for emission of light of red were formed in the same manner as that for forming the stripes of the organic electroluminescence layer for emission of light of green. To be more specific, TPD used as a source was evaporated at an evaporation rate ranging from 0.2 to 0.4 nm/s by resistance heating to form a positive hole transfer layer having a thickness of 50 nm, and then Alq and DCM [4-dicyanomethylene-6-(p-dimethyl aminostyryl)-2-methyl-4H-pyrane] expressed by the following chemical formula 3 used as a source were evaporated by resistance heating to form an electron transfer layer having a thickness of 50 nm. Alq and DCM were separately evaporated using individual targets, and the evaporation rates of Alq and DCM were each adjusted to be in the range of 0.2 to 0.4 nm/s by-controlling powers applied to the evaporation boats. At this time, the evaporation rates of Alq and DCM were measured to avoid occurrence of mutual interference by using two quartz oscillation type film thickness meters, to thereby independently control the evaporation rates of Alq and DCM. In addition, DCM is a material capable of emitting light of red.

Chemical formula 3

Subsequently, a metal electrode layer having a pattern of stripes was formed from an Al—Li alloy film on the stripes of the organic electroluminescence layer for emission of light of red to a thickness of 10 nm by vacuum vapor-deposition in such a manner that the stripes of the metal electrode layer were overlapped on the stripes of the organic electroluminescence layer for emission of light of red.

Then, the vapor-deposition mask was replaced with a vapor-deposition mask having three openings extending perpendicularly to the stripes of the transparent electrode layer and formed in a region where the stripes of the organic electroluminescence layer for emission of light of green and for emission of light of red were not formed. Using such a vapor-deposition mask, the stripes of the organic electroluminescence layer for emission of light of blue were formed in the same manner as that for forming the stripes of the organic electroluminescence layer for emission of light of red. To be more specific, α-NPD expressed by the following chemical formula 4, used as a source, was evaporated to form a positive hole transfer layer having a thickness of 30 nm; bathocuproin expressed by the following chemical formula 5, used as a source, was evaporated to form a hole block layer having a thickness of 15 nm; and Alq used as a source was evaporated to form an electron transfer layer having a thickness of 5 nm. In this way, an organic electroluminescence layer having electroluminescence portions of 8×3×3 pieces was obtained.

chemical formula 4 chemical formula 5

Subsequently, a metal electrode layer having a pattern of stripes was formed from an Al—Li alloy on the stripes of the organic electroluminescence layer for emission of light of blue to a thickness of 10 nm by vacuum vapor-deposition in such a manner that the stripes of the metal electrode layer were overlapped on the stripes of the organic electroluminescence layer for emission of light of blue.

The back sides of the transparent electrode layer, the organic electroluminescence layer, and the metal electrode layer were covered with a sealing vessel made from a stainless steel. After that, the interior of the sealing vessel was coated with a paint containing carbon black, and the sealing vessel was sealed with an ultraviolet hardening-type resin in an argon atmosphere, to thus obtain an organic electroluminescence element.

The organic electroluminescence element thus obtained was evaluated in electroluminescence in a glove box filled with argon gas. As a result, when the element was driven at a drive voltage of 10 V, the maximum wavelength of light emitted from the organic electroluminescence layer was 540 nm for light of green, 620 nm for light of red, and 470 nm for light of blue; and the luminance of light was 500 cd/m$^2$ for light of green, 210 cd/cm$^2$ for light of red, and 500 cd/m$^2$ for light of blue. The luminances different from light of colors were adjusted using a suitable voltage distributing circuit, to obtain an objective white light source. The luminance of the white light source was 500 cd/m$^2$ at a drive voltage of 10 V. Further, the optical reflectance to visible light of the organic electroluminescence element was about 30%.

As a comparative example, an organic electroluminescence element was formed in the same manner as that in this inventive example except that the thickness of the Al—Li alloy film, that is, the metal electrode layer was changed into 200 nm. The organic electroluminescence element was evaluated in electroluminescence in the same manner as that in this inventive example. As a result, it was revealed that the display contrast of the organic EL display using the organic electroluminescence element in this inventive example was as high as about 2.7 times that of the organic EL display using the organic electroluminescence element in the comparative example when compared at the same luminance.

FOURTH EXAMPLE

In this example, first, there was prepared a transparent substrate made from a glass sheet having a size of 30 mm×30 mm, on which a transparent electrode layer was previously formed from ITO film to a thickness of 200 nm. Then, the transparent electrode layer was patterned, and stripes for emission of light of green, red and blue of an organic electroluminescence layer and a metal electrode layer were formed, in the same manner as that in the third example except that an Al film having a thickness of 10 nm was formed as the metal electrode layer.

A transparent conductive layer was formed from ITO film to a thickness of 300 nm in the same manner as that in the second example.

A glass sheet having a thickness of 5 nm, which was colored in black for blocking transmission of light therethrough, was disposed to entirely cover the back sides of the transparent electrode layer, the organic electroluminescence layer, the metal electrode layer, and the transparent conductive layer. The side, facing to the above layers, of the glass sheet was frosted. Then, a sealing vessel made from a stainless steel was disposed to entirely cover the back sides of the transparent electrode layer, the organic electroluminescence layer, the metal electrode layer, and the transparent conductive layer. After that, the interior of the sealing vessel was coated with a paint containing carbon black, and the sealing vessel was sealed with an ultraviolet hardening-type resin in an argon atmosphere, to thus obtain an organic electroluminescence element.

The organic electroluminescence element thus obtained was evaluated in electroluminescence in a glove box filled with argon gas. As a result, the element exhibited a luminance of 500 cd/m$^2$ at a drive voltage of 10 V. Further, the optical reflectance to visible light of the element was about 30%.

As a comparative example, an organic electroluminescence element was formed in the same manner as that in this inventive example except that the thickness of the Al—Li alloy film, that is, the metal electrode layer was changed into 200 nm. The organic electroluminescence element was evaluated in electroluminescence in the same manner as that in this inventive example. As a result, it was revealed that the display contrast of the organic EL display using the organic electroluminescence element in this inventive example was as high as about 2.7 times that of the organic EL display using the organic electroluminescence element in the comparative example when compared at the same luminance.

FIFTH EXAMPLE

In this example, first, there was prepared a transparent substrate (sheet resistance: 10 Ω/cm$^2$) made from glass, on which a transparent electrode layer was previously formed from ITO film to a thickness of 200 nm. Then, an organic electroluminescence layer and a metal electrode layer were formed in the same manner as that in the first example.

Subsequently, a conductive layer was provided by forming an iron film having a thickness of 200 nm by vacuum vapor-deposition, to thus obtain an organic electroluminescence element.

The organic electroluminescence element thus obtained was evaluated in electroluminescence in a glove box filled with argon gas. As a result, when being driven at a drive voltage of 10 V and a current density of 10 mA/cm$^2$, the organic electroluminescence element emitted light of green and exhibited a luminance of about 500 cd/cm$^2$. Further, the optical reflectance to visible light of the organic electroluminescence element was about 50%.

As a comparative example, an organic electroluminescence element was formed in the same manner as that in this inventive example except that the thickness of the Mg—Ag alloy film, that is, the metal electrode layer was changed into 200 nm. The organic electroluminescence element was evaluated in electroluminescence in the same manner as that in this inventive example. As a result, the optical reflectance to visible light of the organic electroluminescence element was about 80%, and the display contrast of an organic EL display using the organic electroluminescence element was 5:1.

As the result of the above evaluation, it was revealed that the display contrast of the organic EL display using the organic electroluminescence element in this inventive example was as high as about 1.6 times that of the organic EL display using the organic electroluminescence element in the comparative example when compared at the same luminance.

While the preferred embodiments and examples of the present invention have been described, the present invention is not limited thereto. For example, in the above embodiments, the metal electrode layer 14 is stacked on the organic electroluminescence layer 13; however, a thin film made from lithium fluoride (LiF) or aluminum oxide (Al$_2$O$_3$) may be held between the organic electroluminescence layer 13 and the metal electrode layer 14.

In the second, third, fourth and fifth embodiments, the low optical reflection layer 21 includes the layer made from an organic compound or black paint formed by dispersing carbon black or aniline black into a high polymer binder such as a cellulose based resin, however, such a layer made from an organic compound or black paint may be replaced with a film or sheet having circular polarization or polarization. Further, the surface of the layer made from an organic compound or black paint, or the above film or sheet may be made uneven to promote scattering of light. That is to say, the low optical reflection layer 21 may be configured to absorb light having transmitted through the metal electrode layer 14 by selection of the material for forming the low optical reflection layer, or may be configured to catch the incident light. In addition, the layer made from an organic compound or black paint, or the above film or sheet may constitute part of a sealing structure for shielding the organic electroluminescence element from oxygen, moisture and the like in atmospheric air.

In the fourth embodiment, the specular reflection of light from the metal electrode layer 14 can be more certainly prevented by forming a layer having an optical reflectance to visible light specified in a range of 10% or less on the metal electrode layer 14 in such a manner as to be in contact therewith, and forming the low optical reflection layer 21 in such a manner as not to be in contact with the above layer.

In the fifth embodiment, the specular reflection of light from the metal electrode layer 14 can be more certainly prevented by forming a layer having an optical reflectance to visible light specified in a range of 10% or less on the transparent conductive layer 31 in such a manner as to be in contact therewith, and forming the low optical reflection layer 21 in such a manner as not to be in contact with the above layer.

In each of the embodiments, fine particles having a light absorptivity may be contained in the transparent substrate 11. Also, the surface of the transparent substrate 11 may be coated with a film for promoting absorption of light. Additionally, slight unevenness may be provided on the surface of the transparent substrate 11.

In the first to third embodiments, like the fourth embodiment, the sealing vessel 41 may be provided. With this configuration, the organic electroluminescence element 10 or 60 can be shielded from atmospheric air.

In each of the embodiments, if a plurality of electroluminescence elements are formed on one transparent substrate 11 in a matrix, a black matrix in which each space between the elements is blackened may be adopted as generally used in a television receiver, or a color filter may be adopted as generally used in a liquid crystal display element.

What is claimed is:

1. An organic luminescence element comprising:

a first electrode layer;

an organic electroluminescence layer formed adjacent to one surface of said first electrode layer;

a second electrode layer formed adjacent to the other surface of said organic luminescence layer, said second electrode layer having an optical reflectance to visible light specified in a range of 50% or less;

a low optical reflection layer formed on said second electrode layer on the opposed side to said surface adjacent to said organic electroluminescence layer, said low optical reflection layer comprising at least one or more layers including a layer having an optical reflectance to visible light specified in a rang of 10% or less; and a conductive layer provided between said second electrode layer and said low optical reflection layer, said conductive layer constituting an electrode portion in combination with said second electrode layer.

2. An organic electroluminescence element according to claim 1, wherein said conductive layer has an optical reflectance to visible light specified in a range of 10% or less.

3. An organic electroluminescence element according to claim 1, wherein said conductive layer is made from a transparent material.

4. An organic electroluminescence element according to claim 1, wherein said conductive layer is made from any one of indium-tin oxide, a zinc oxide-indium oxide based complex oxide, and tin oxide, or a high polymer material formed by polymerizing any one of aniline, thiophene, and acetylene.

5. An organic electroluminescence element according to claim 1, wherein at least part of said low reflection layer is in contact with said conductive layer.

6. An organic luminescence element comprising:

a first electrode layer;

an organic electoluminescence layer formed adjacent to one surface of said first electrode layer;

a second electrode layer formed adjacent to the other surface of said organic luminescence layer, said second electrode layer having an optical reflectance to visible light specified in a range of 50% or less; and a low optical reflection layer formed on said second electrode layer on the opposed side to said surface adjacent to said organic electroluminescence layer and disposed in such a manner as not to be in contact with said second electrode layer while facing to said second electrode layer, said low optical reflection layer comprising at least one or more layers including a layer having an optical reflectance to visible light specified in a range of 10% or less.

7. An organic luminescence element comprising:

a first electrode layer;

an organic electoluminescence layer formed adjacent to one surface of said first electrode layer;

a second electrode layer formed adjacent to the other surface of said organic luminescence layer, said second electrode layer having an optical reflectance to visible light specified in a range of 50% or less; and a low optical reflection layer formed on said second electrode layer on the opposed side to said surface adjacent to said organic electroluminescence layer, wherein a stacked body composed of said first electrode layer, said organic electroluminescence layer, and said second electrode layer is formed on a transparent substrate, and said stacked body is sealed in a sealing vessel which is in close-contact with said transparent substrate and wherein said low optical reflection layer is disposed on an inner surface of said sealing vessel in such a manner as not to be in contact with said second electrode layer while facing to said second electrode layer.

8. An organic electroluminescence element according to claim 7, further comprising a conductive layer provided between said second electrode layer and said low optical reflection layer, said conductive layer constituting an electrode portion in combination with said second electrode layer.

9. An organic electroluminescence element according to claim 8, wherein said conductive layer is made from any one of beryllium, copper, chromium, iron, molybdenum, nickel, platinum, tungsten, lead, tin, antimony, strontium, and titanium, or an alloy of said metals.

10. An organic luminescence element comprising:

a first electrode layer;

an organic electroluminescence layer formed adjacent to one surface of said first electrode layer;

a second electrode layer formed adjacent to the other surface of said organic luminescence layer, said second electrode layer having an optical reflectance to visible light specified in a range of 50% or less; and a conductive layer formed on said second electrode layer on the opposed side to said surface adjacent to said organic electroluminescence layer in such a manner as to be in close contact therewith and to have a shape along the surface of said second electrode layer, said conductive layer constituting an electrode portion in combination with said second electrode layer;

wherein said conductive layer is made from silicon carbide, or a high polymer material formed by polymerizing any one of aniline, thiophene, and acetylene.

* * * * *